US012796406B2

(12) United States Patent
Shinagawa et al.

(10) Patent No.: US 12,796,406 B2
(45) Date of Patent: Nov. 10, 2026

(54) SYSTEM AND METHOD OF PULSE SCORING

(71) Applicant: Tokyo Electron Limited, Tokyo (JP)

(72) Inventors: Jun Shinagawa, Fremont, CA (US); Merritt Funk, Austin, TX (US); Barton Lane, Austin, TX (US); Ivan Maleev, Fremont, CA (US); Justin Moses, Austin, TX (US); Christian Williams, Austin, TX (US); Shyam Sridhar, Austin, TX (US); Peter Lowell George Ventzek, Austin, TX (US); Yohei Yamazawa, Taiwa-cho (JP); Masashi Yamaguchi, Taiwa-cho (JP); Hiromasa Mochiki, Taiwa-cho (JP); Mitsunori Ohata, Taiwa-cho (JP)

(73) Assignee: Tokyo Electron Limited, Tokyo (JP)

( * ) Notice: Subject to any disclaimer, the term of this patent is extended or adjusted under 35 U.S.C. 154(b) by 283 days.

(21) Appl. No.: 18/608,285

(22) Filed: Mar. 18, 2024

(65) Prior Publication Data

US 2025/0293095 A1 Sep. 18, 2025

(51) Int. Cl.
*H10P 74/00* (2026.01)
*H10P 50/24* (2026.01)
*H10P 72/00* (2026.01)

(52) U.S. Cl.
CPC ............ *H10P 74/23* (2026.01); *H10P 50/242* (2026.01); *H10P 72/06* (2026.01)

(58) Field of Classification Search
CPC ......... H10P 74/23; H10P 50/242; H10P 72/06
USPC ............................................................ 216/86
See application file for complete search history.

(56) References Cited

U.S. PATENT DOCUMENTS

| | | | | |
|---|---|---|---|---|
| 9,200,950 | B2 | 12/2015 | Lian et al. | |
| 9,466,466 | B1 | 10/2016 | Zhong et al. | |
| 9,627,186 | B2 * | 4/2017 | Valcore, Jr. | G01J 1/42 |
| 10,314,154 | B1 | 6/2019 | Hsu et al. | |
| 10,802,406 | B2 | 10/2020 | Hsieh et al. | |
| 2016/0131587 | A1 * | 5/2016 | Meloni | H01J 37/32935 250/206 |
| 2017/0207070 | A1 * | 7/2017 | Kabouzi | H01J 37/32082 |
| 2022/0367149 | A1 * | 11/2022 | Funk | H01J 37/32146 |

(Continued)

OTHER PUBLICATIONS

International Search Report and Written Opinion issued Apr. 25, 2025 in PCT/US2025/011165, 8 pages.

(Continued)

*Primary Examiner* — Duy Vu N Deo
(74) *Attorney, Agent, or Firm* — Oblon, McClelland, Maier & Neustadt, L.L.P.

(57) ABSTRACT

A method of pulse scoring is provided. The method includes executing a plasma process pulsed between a first state and a second state. In-situ data measured by in-situ sensors are collected while the plasma process is being executed. The in-situ data are processed to obtain first pulse features of the first state and second pulse features of the second state. Metrology data are collected after executing the plasma process. The first pulse features, the second pulse features and the metrology data are analyzed to determine pulse scores that are interaction terms of the first pulse features and the second pulse features and have correlations above a target threshold with the metrology data in regression analysis.

20 Claims, 11 Drawing Sheets

(56) References Cited

U.S. PATENT DOCUMENTS

2024/0055243 A1 * 2/2024 Kim .................. H01J 37/32917

OTHER PUBLICATIONS

Hippler et al. ; Time-resolved optical emission spectroscopy of a unipolar and a bipolar pulsed magnetron sputtering discharge in an argon/oxygen gas mixture with a cobalt target ; Plasma Sources Science and Technology, 28 ; Nov. 28, 2019 ; 14 Pages.

* cited by examiner

SYSTEM AND METHOD OF PULSE SCORING

INCORPORATION BY REFERENCE

Aspects of the present disclosure are related to U.S. application Ser. No. 17/025,651 filed on Sep. 18, 2020 titled "VIRTUAL METROLOGY FOR WAFER RESULT PREDICTION" and U.S. Pat. No. 11,669,079, both of which are incorporated herein by reference in their entirety.

FIELD OF THE INVENTION

This disclosure relates generally to semiconductor fabrication and more particularly to pulsed plasma processes.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Particularly, plasma processing plays a vital role in material deposition and removal in the production of semiconductor chips. Typical examples include plasma-assisted chemical vapor deposition, plasma-assisted physical vapor deposition, plasma etching, plasma cleaning, etc.

SUMMARY

The present disclosure relates to a method of pulse scoring and an apparatus of executing the same.

According to a first aspect of the disclosure, a method of pulse scoring is provided. The method includes executing a plasma process pulsed between a first state and a second state. In-situ data measured by in-situ sensors are collected while the plasma process is being executed. The in-situ data are processed to obtain first pulse features of the first state and second pulse features of the second state. Metrology data are collected after executing the plasma process. The first pulse features, the second pulse features and the metrology data are analyzed to determine pulse scores that are interaction terms of the first pulse features and the second pulse features and have correlations above a target threshold with the metrology data in regression analysis.

In some embodiments, a virtual metrology (VM) model is built that is configured to predict a wafer characteristic resulting from the plasma process based on the pulse scores.

In some embodiments, the plasma process includes a plasma etching process. The wafer characteristic includes a critical dimension, an etching rate or a combination thereof.

In some embodiments, a plurality of VM models are built, each configured to predict a wafer characteristic resulting from the plasma process based on respective independent variables. A subset of VM models are select from the plurality of VM models. The subset of VM models determined to make reliable predictions within a threshold. Respective independent variables of the subset of VM models are selected to be the pulse scores.

In some embodiments, a control model is built that describes relationships between the pulse scores and pulse control knobs.

In some embodiments, when the pulse scores are outside target ranges, a failure mode of a plasma tool is identified.

In some embodiments, when the failure mode is fixable by adjusting the pulse control knobs, adjustment of the pulse control knobs required to set the pulse scores to the target ranges is determined using the control model.

In some embodiments, when the failure mode is not fixable by adjusting the pulse control knobs, maintenance work is performed on the plasma tool.

In some embodiments, adjustment of pulse control knobs required to minimize a cost function of the pulsing scores is determined.

In some embodiments, the pulse control knobs include at least one selected from the group consisting of a pulse duty cycle knob, a pulse frequency knob, a pulse delay source-bias knob, a bias power knob, a source power knob, a match position knob and a pressure knob.

In some embodiments, the pulse scores include a ratio of one of the first pulses to one of the second pulse features.

In some embodiments, the plasma process is pulsed using at least one pulsed signal selected from the group consisting of a source power of a plasma source and a bias power applied on a wafer.

In some embodiments, in the first state, the source power is on while the bias power is off. In the second state, the source power is on while the bias power is on.

In some embodiments, the pulse scores include a first ratio of radical density of the first state to radical density of the second state, a second ratio of by-product generation of the first state to by-product generation of the second state, a third ratio of electron density of the first state to electron density of the second state, and a fourth ratio of bias voltage of the first state to bias voltage of the second state.

In some embodiments, etching is only activated during the second state when the first ratio is between 0.8 and 1.2, the second ratio is smaller than 1, the third ratio is between 0.8 and 1.2, and the fourth ratio is smaller than 1.

In some embodiments, in the first state, the source power is on while the bias power is off. In the second state, the source power is off while the bias power is on.

In some embodiments, the pulse scores include a first ratio of radical density of the first state to radical density of the second state, a second ratio of by-product generation of the first state to by-product generation of the second state, a third ratio of electron density of the first state to electron density of the second state, and a fourth ratio of bias voltage of the first state to bias voltage of the second state. Etching is only activated during the second state when the first ratio is larger than 1, the second ratio is smaller than 1, the third ratio is larger than 1, and the fourth ratio is smaller than 1.

In some embodiments, when the bias power is pulsed, the bias power has a duty cycle of 10%-90%.

In some embodiments, the plasma process is pulsed at a frequency of 1 Hz to 100 kHz.

In some embodiments, the source power is a constant in both the first state and the second state, and the bias power is 0V in the first state and another constant in the second state.

In some embodiments, the source power is a constant in the first state and 0V in the second state, and the bias power is 0V in the first state and another constant in the second state.

According to a second aspect of the disclosure, an apparatus is provided. The apparatus includes a controller including a processor that is programmed to execute a plasma process pulsed between a first state and a second state. In-situ data measured by in-situ sensors are collected while the plasma process is being executed. The in-situ data are processed to obtain first pulse features of the first state and second pulse features of the second state. Metrology data are collected after executing the plasma process. The first pulse features, the second pulse features and the metrology data are analyzed to determine pulse scores that are interaction terms of the first pulse features and the second pulse features and have correlations above a target threshold with the metrology data in regression analysis.

Note that this summary section does not specify every embodiment and/or incrementally novel aspect of the present disclosure or claimed invention. Instead, this summary only provides a preliminary discussion of different embodiments and corresponding points of novelty. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
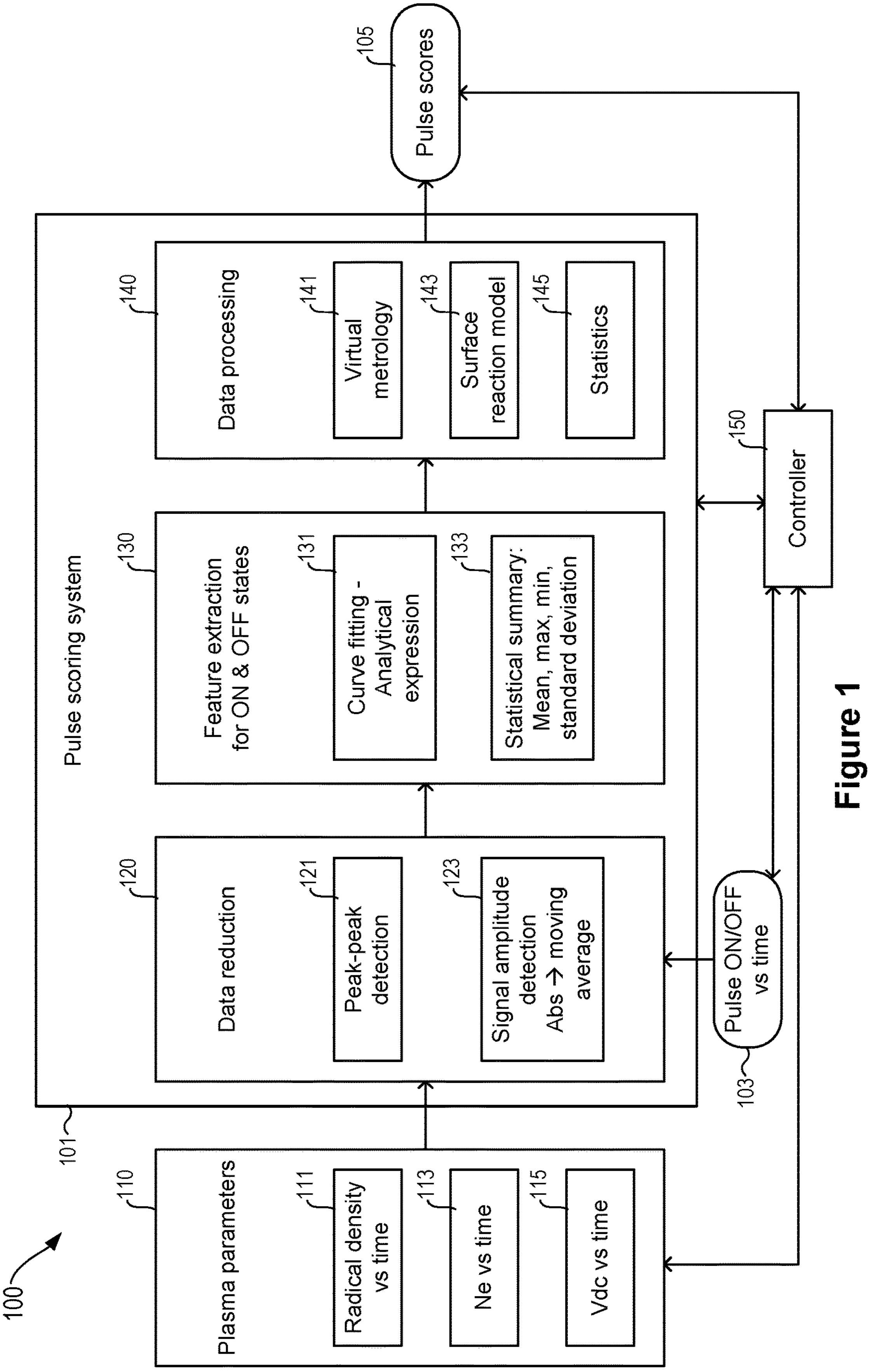
FIG. 1 shows a system of pulse scoring in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity's sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

In the drawings, like reference numerals designate identical or corresponding parts throughout the several views. Additionally, as used herein, the words "a", "an" and the like generally carry a meaning of "one or more", unless stated otherwise.

Furthermore, the terms, "approximately", "approximate", "about" and similar terms generally refer to ranges that include the identified value within a margin of 20%, 10%, or preferably 5%, and any values therebetween.

As noted in the Background, plasma processing plays a vital role in semiconductor manufacturing. Applicant's copending U.S. application Ser. No. 17/025,651 filed on Sep. 18, 2020 titled "VIRTUAL METROLOGY FOR WAFER RESULT PREDICTION" and Applicant's U.S. Pat. No. 11,669,079 both disclose process optimization and control for non-pulsed (continuous-wave) plasma systems.

Compared with traditional continuous-wave plasmas, pulsed (power-modulated) plasmas can have several advantages. For instance, pulsed plasmas can offer a higher etching rate and better uniformity with less damage. Pulsed plasmas can also be utilized to ameliorate unwanted wafer artefacts such as notching, bowing, chipping and micro-trenching.

However, commonly used pulse quality metrics in pulsed plasma processes lack a direct relationship with process results such as etching rate (ER), critical dimension (CD), etc., making it difficult to develop process control or process optimization applications. Instead, multi-dimensional pulsed plasma process settings are often optimized based on wafer results, resulting in a long optimization turnaround time. As pulse technology becomes more and more ubiquitous to meet ever-tightening process specification requirements imposed by advancing device technologies, state-of-the-art pulsed plasma systems are falling short of the industry's expectations.

U.S. Pat. No. 10,802,406B2 describes an apparatus for generating extreme ultraviolet (EUV) radiation including a droplet generator configured to generate target droplets. An excitation laser is configured to heat the target droplets using excitation pulses to convert the target droplets to plasma. An energy detector is configured to measure a variation in EUV energy generated when the target droplets are converted to plasma. A feedback controller is configured to adjust parameters of the droplet generator and/or the excitation laser based on the variation in EUV energy. Plasma is used as a way of probing EUV energy variations instead of typical semiconductor processes.

US946646B1 describes a method for optimizing critical dimension uniformity (CDU) by identifying an operation of a recipe for processing a substrate within a chamber. The operation is configured to provide a pulsed radio frequency (RF) to the chamber. A plurality of tests are performed in the chamber for the operation utilizing the pulsed RF, each test having a duty cycle for the pulsed RF selected from a plurality of RF duty cycles. However, no sensor is used to characterize or monitor the operation. Rather, the operation results are characterized afterwards.

U.S. Pat. No. 9,627,186B2 describes a system for using optical data to monitor RF generator operations. Pulsed RF optimization can be realized by statistics of plasma density with no optical spectra. US20160131587 describes a method for monitoring a pulsed plasma process by averaging sub-units within the pulse shape to enhance a ratio of signal to noise. No control knob is utilized or adjusted. Each of the aforementioned references suffers from one or more drawbacks hindering their adoption.

Techniques herein provide a robust and reliable pulsed plasma method and system (e.g. hardware), which can be utilized for process control and process optimization applications. The pulsed plasma method herein leverages clearly defined pulse quality metrics termed "pulse scores" as well as key performance indicators (KPI) defined with in-situ sensor data. Notably, virtual metrology (VM) technology can be used to define the "pulse scores" to represent pulse quality.

According to aspects of the disclosure, the pulse scoring method can define pulse quality indices based on virtual metrology, a surface reaction model and/or statistics (repeatability, 3-sigma, etc.). Multi-dimensional pulse settings can thus be optimized using the pulse scoring method and system, which can shorten the optimization cycle.

FIG. 1 shows a process 100 of pulse scoring in accordance with some embodiments of the present disclosure. A pulsed plasma can be generated and characterized by one or more sensors such as in-situ plasma sensors e.g. an optical emission spectroscope, a radio frequency sensor, a photodiode, an ellipsometer, a reflectometer, etc. The pulsed plasma can be utilized for various purposes, such as etching, film deposition, cleaning, surface activation and modification, etc. Plasma etching will be described hereinafter in this disclosure for illustrative purposes and is not intended to be limiting.

In block 110, plasma parameters can be collected for a plasma etching process. For example in block 111, data of radical density versus time can be collected during the plasma etching process. In block 113, data of electron density (Ne) versus time can be collected. In block 115, data of voltage of a direct current (Vdc) versus time can be collected. The plasma parameters or the aforementioned data are sent to block 101 which can be configured to function as a pulse scoring system.

In block 120, data reduction is accomplished. Block 120 can receive the plasma parameters from block 110 as well as data 103 of pulse ON/OFF vs time. In block 121, peak-peak detection is executed. In block 123, signal amplitude detection is executed. For instance, absolute values can be converted to moving averages.

In block 130, features are extracted for ON and OFF states. In block 131, curve fitting can be executed to obtain an analytical expression. In block 133, a statistical summary can be obtained that includes mean, maximal and minimal values, standard deviation and the like.

In block 140, data can be processed with pulse scoring definitions, for example based on virtual metrology (VM) in block 141, based on a surface reaction model in block 143, based on statistics in block 145, and/or the like. As a result, pulse scores 105 are obtained. When using VM, pulse score variables can be determine by a VM model (e.g. ER~f(v1, v2, v3) with vi=pulse score variable). When using a surface reaction model, success criteria can be set by what is expected from the surface reaction model. Statistics can help improve repeatability, stability etc. For instance, the pulse scores 105 can include interaction terms of the first pulse features and the second pulse features and have correlations above a target threshold with measured metrology data in regression analysis. Pulse scoring will be further explained in FIGS. 2, 3, 4A-4C and 5A-5D.

In some embodiments, a controller 150 may optionally be included in the example of FIG. 1. Components of a corresponding plasma tool can be connected to and controlled by the controller 150 that may optionally be connected to a corresponding memory storage unit and user interface (all not shown). Various plasma-processing operations can be executed via the user interface, and various plasma processing recipes and operations can be stored in a storage unit. Accordingly, a given wafer can be processed within a plasma chamber with various microfabrication techniques.

It will be recognized that the controller 150 may be coupled to various components of the corresponding plasma tool to receive inputs from and provide outputs to the components. The controller 150 can also be configured to adjust knobs and control settings for the corresponding plasma tool. Of course the adjustments can be manually made as well.

It will also be recognized that the controller 150 may be coupled to various components of the process 100 to receive inputs from and provide outputs to the components. For example, the controller 150 can be configured to receive the plasma parameters from block 110, the statistical summary from block 133, the pulse scores 105 and/or the like. The controller 150 can also be configured to output the statistical summary to block 140 and output the pulse scores 105 to the user interface.

The controller 150 can further be configured to implement blocks of the process 100. For example, the controller 150 can implement block 110 by collecting the plasma parameter from sensors, implement block 120 by performing the data reduction, implement block 130 by extracting features and/or implement block 140 by processing data. Similarly, the controller 150 can implement blocks 111, 113, 115, 121, 123, 131, 133, 141, 143 and/or 145. Of course, one or more functions of the controller 150 can also be manually accomplished.

The controller 150 can be implemented in a wide variety of manners. In one example, the controller 150 is a computer. In another example, the controller 150 includes one or more programmable integrated circuits that are programmed to provide the functionality described herein. For example, one or more processors (e.g. microprocessor, microcontroller, central processing unit, etc.), programmable logic devices (e.g. complex programmable logic device (CPLD)), field programmable gate array (FPGA), etc.), and/or other programmable integrated circuits can be programmed with software or other programming instructions to implement the functionality of a proscribed plasma process recipe. It is further noted that the software or other programming instructions can be stored in one or more non-transitory computer-readable mediums (e.g. memory storage devices, FLASH memory, DRAM memory, reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Figure 2:
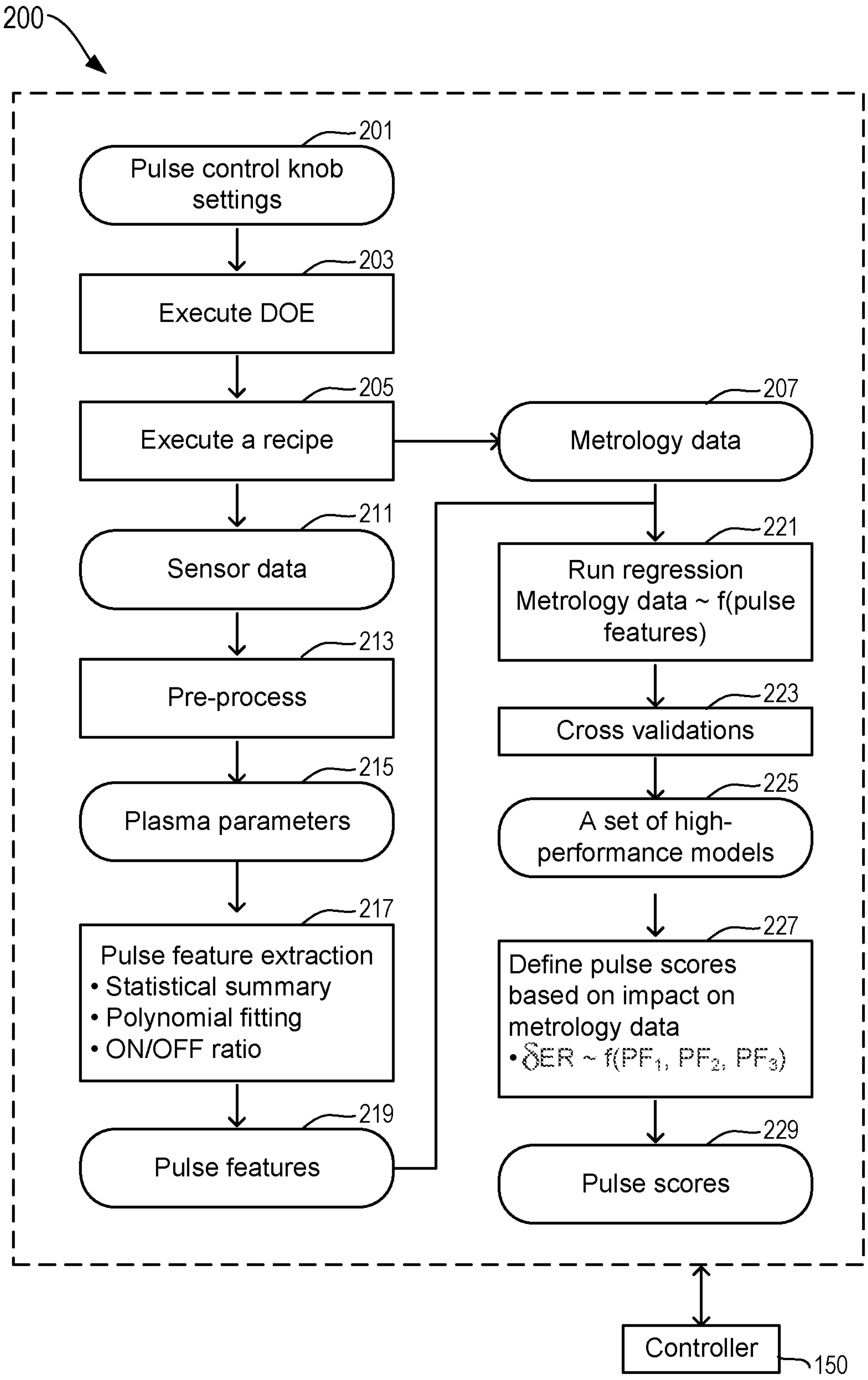
FIG. 2 shows a block diagram of pulse scoring based on virtual metrology, in accordance with some embodiments of the present disclosure.

FIG. 2 shows a block diagram of a process 200 of pulse scoring based on virtual metrology (VM), in accordance with some embodiments of the present disclosure. In block 203, pulse control knob settings 201 are used to execute design of experiments (DOE) to select a subset of the pulse control knob settings 201 that are relevant to a plasma etching process. In block 205, a recipe e.g. a plasma etching recipe is executed in a plasma chamber.

Sensor data 211 can be collected while the recipe is being executed in block 205. For example, the sensor data 211 may include data of radical density versus time, data of electron density (Ne) versus time, data of voltage of a direct current (Vdc) versus time and the like. The sensor data 211 are pre-processed in block 213 to obtain plasma parameters 215. For example, the plasma parameter 215 may include the radical density, the electron density, the voltage and the like. In block 217, pulse features 219 can be extracted from the plasma parameters 215, for example by polynomial fitting. The pulse features 219 may include a statistical summary (e.g. mean, maximal and minimal values, standard deviation, etc.), an ON/OFF ratio and the like.

Metrology data 207 are collected after the recipe is executed in block 205. For instance in the case of plasma etching, the metrology data 207 can include film thickness, a cross-sectional profile and the like. It should be understood that the metrology data 207 can also be collected before the recipe is executed in block 205.

In block 221, regression is run using the metrology data 207 and the pulse features 219. A plurality of virtual metrology (VM) models can be generated to each describe the metrology data 207 as a respective function of the pulse features 219, such as critical dimension (CD)=f(pulse features), etching rate (ER)=f(pulse features) and the like. CD and ER may be functions of different independent variables, meaning specific pulse features that CD and ER depend on may differ. CD or ER may each be expressed in more than one function of the pulse features 219, and each function may have respective independent variables.

In block 223, the plurality of VM models are cross-validated to select a subset of VM models, such as a set of high-performance models 225 determined to make reliable predictions within a threshold. In block 227, respective independent variables of the set of high-performance models 225 can be selected to be pulse scores 229. Particularly, the pulse scores 229 can be defined based on their impact on the metrology data 207. For example, when $\delta ER=f(PF_1, PF_2, PF_3)$ belongs to the set of high-performance models 225, $PF_1$, $PF_2$ and $PF_3$ will be selected to be the pulse scores 229.

In some embodiments, the controller 150 may optionally be coupled to various components of the process 200 to receive inputs from and provide outputs for the components as well as implement the components, similar to the process 100 in FIG. 1. The descriptions have been provided above and will be omitted herein for simplicity purposes.

Figure 3:
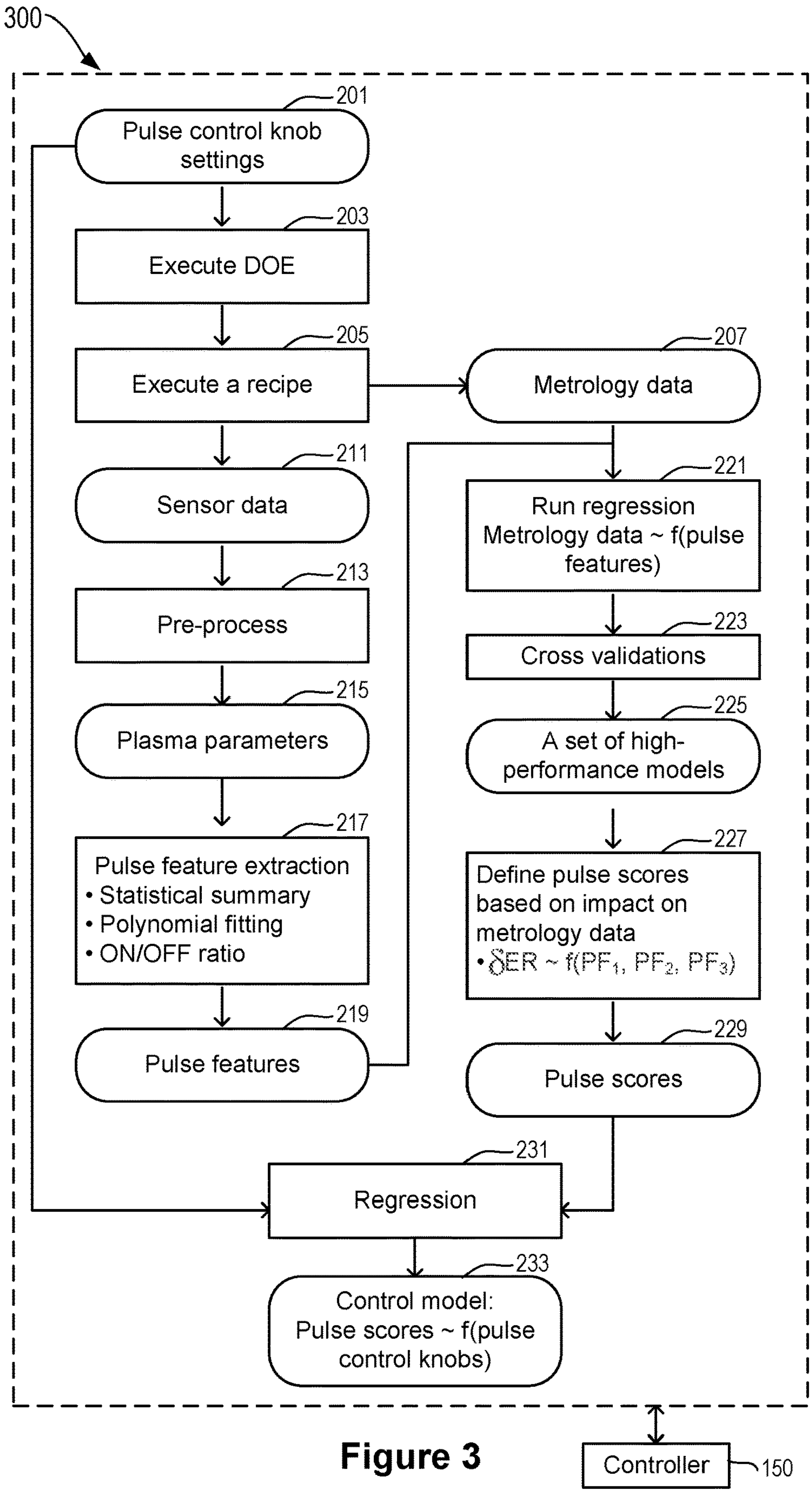
FIG. 3 shows a block diagram of building a control model based on virtual metrology, in accordance with some embodiments of the present disclosure.

FIG. 3 shows a block diagram of a process 300 of building a control model based on virtual metrology, in accordance with some embodiments of the present disclosure. The process 300 herein is similar to the process 200 in FIG. 2. Identical numerals can denote identical or similar components unless specified otherwise. In block 231, regression is run using the pulse control knob settings 201 and the pulse scores 229 to build a control model 233 that describes relationships between the pulse scores 229 and the pulse control knob settings 201. For example, the pulse scores 229 can be expressed as a function of the pulse control knob settings 201: Pulse score=f(pulse control knob settings). Additionally, multi-variant least square regression can be run for each pulse score.

Figures 4A, 4B, 4C:
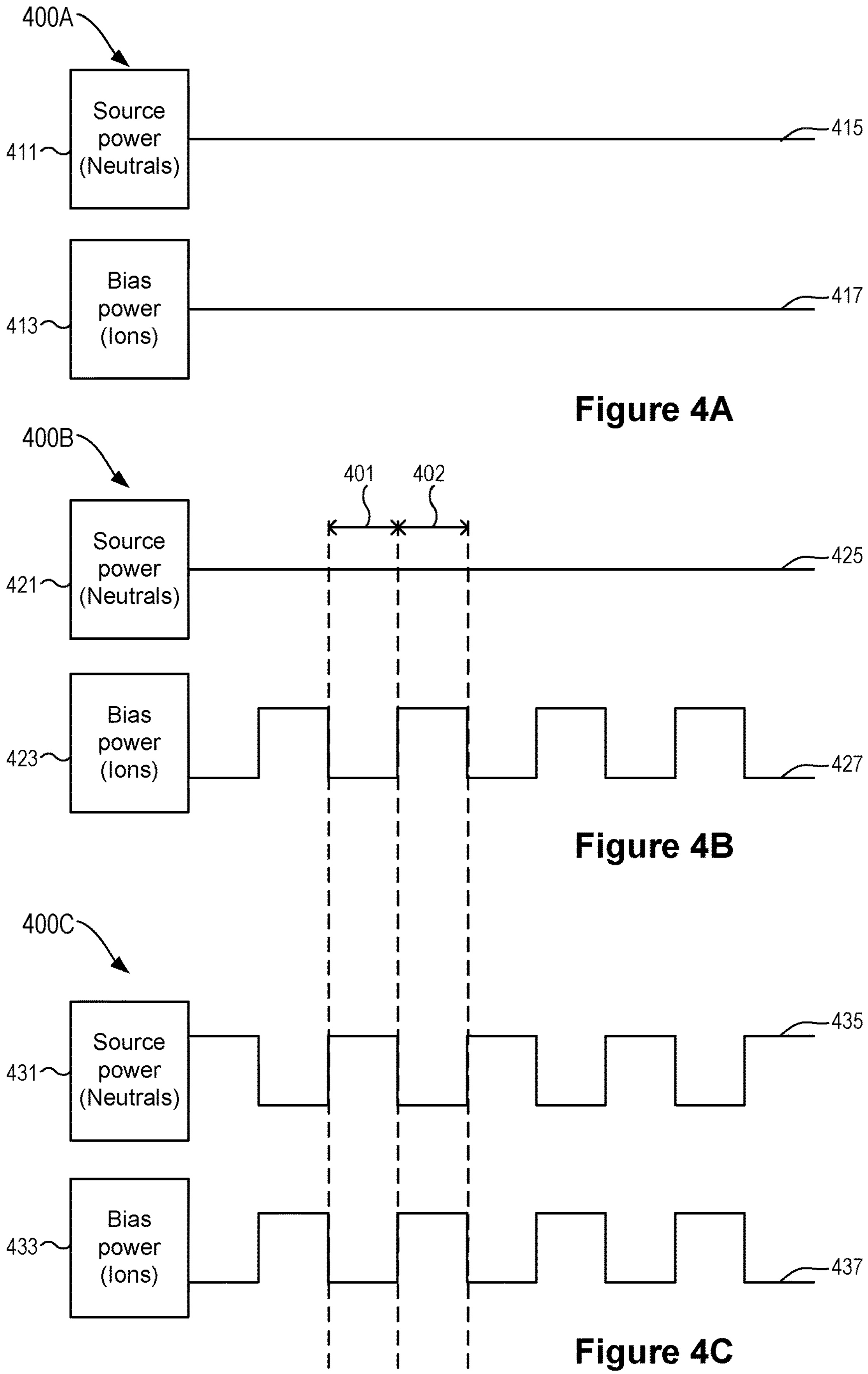
FIG. 4A shows a schematic of a continuous plasma process, in related examples.
FIG. 4B shows a schematic of a pulsed plasma process, in accordance with one embodiment of the present disclosure.
FIG. 4C shows a schematic of another pulsed plasma process, in accordance with another embodiment of the present disclosure.

FIG. 4A shows a schematic of a first plasma process 400A in related examples. As shown, the first plasma process 400A includes a continuous plasma. A source power 411 and a bias power 413 are respectively represented by flat lines 415 and 417. In other words, the source power 411 and the bias power 413 are both maintained at continuous and constant values during the first plasma process 400A.

FIG. 4B shows a schematic of a second plasma process 400B, in accordance with one embodiment of the present disclosure. As shown, the second plasma process 400B includes a pulsed plasma. A source power 421 (e.g. of a plasma source) and a bias power 423 (e.g. on a wafer) are respectively represented by lines 425 and 427. The source power 421 can be maintained at a constant value during the second plasma process 400B while the bias power 423 is pulsed between a first state 401 and a second state 402. Specifically, the bias power 423 is OFF in the first state 401 and ON in the second state 402. The bias power 423 can have a duty cycle of 10%-90%, e.g. 10%, 30%, 50%, 70%, 90% or any values therebetween.

TABLE 1

Examples of pulse features and pulse scores

| | | | 401 | 402 | |
|---|---|---|---|---|---|
| | | | 421 ON | | Pulse |
| Process target | Sensor | Plasma parameters | 423 OFF | 423 ON | Scores: 401/403 |
| Bias power pulse: To activate etching only during bias power ON | OES* | Radical density | High | High | ~1 |
| | | By-product | Low | High | <1 |
| | VI** | Ne | High | High | ~1 |
| | | Vbias | Low | High | <1 |

*OES: optical emission spectroscopy.
**VI: voltage current sensor.

Table 1 above shows a few examples of pulse features and pulse scores of the second plasma process 400B. In the first state 401, the source power 421 is ON while the bias power 423 is OFF. Accordingly, neutrals (or neutral species such as radicals) can be generated with few or no ions generated, corresponding to a relatively high radical density, a relatively low by-product signal, a relatively high electron density (Ne) and a relatively low bias voltage.

In the second state 402, the source power 421 and the bias power 423 are both ON. Accordingly, neutrals and ions can both be generated, corresponding to a relatively high radical density, a relatively high by-product signal, a relatively high electron density (Ne) and a relatively high bias voltage.

Pulse scores can thus be obtained as interaction terms of pulse features of the first state 401 and pulse features of the second state 402. Such pulse features can include, but are not limited to, radical density, by-product generation/signal, electron density and bias voltage. The pulse scores can then be utilized to evaluate the plasma etching process, e.g. to determine whether etching is achieved only in the second state 402 relative to the first state 401, or to accelerate pulse optimization by plasma diagnostics without etching patterned wafer coupons.

In this example, four ratios can be obtained: a first ratio of radical density of the first state 401 to radical density of the second state 402, a second ratio of by-product generation of the first state 401 to by-product generation of the second state 402, a third ratio of electron density of the first state 401 to electron density of the second state 402, and a fourth ratio of bias voltage of the first state 401 to bias voltage of the second state 402. Particularly, etching is only activated during the second state 402 when the first ratio is close to 1 (e.g. 0.8, 0.9, 1.0, 1.1, 1.2, or any values therebetween), the second ratio is smaller than 1 (e.g. 0, 0.001, 0.01, 0.1, 0.3, 0.5, 0.7, or any values therebetween), the third ratio is close to 1 (e.g. 0.8, 0.9, 1.0, 1.1, 1.2, or any values therebetween), and the fourth ratio is smaller than 1 (e.g. 0, 0.001, 0.01, 0.1, 0.3, 0.5, 0.7, or any values therebetween).

FIG. 4C shows a schematic of a third plasma process 400C, in accordance with another embodiment of the present disclosure. As shown, the third plasma process 400C includes a pulsed plasma. A source power 431 (e.g. of a plasma source) and a bias power 433 (e.g. on a wafer) are respectively represented by lines 435 and 437. The source power 431 and the bias power 433 are both pulsed between the first state 401 and the second state 402 with a duty cycle of 10%-90%, e.g. 10%, 30%, 50%, 70%, 90% or any values therebetween.

TABLE 2

Examples of pulse features and pulse scores

| Process target | Sensor | Plasma parameters | 401 431 ON 433 OFF | 402 431 OFF 433 ON | Pulse Scores: 401/403 |
|---|---|---|---|---|---|
| To activate etching on | OES* | Radical density | High | Low | >1 |
| self-limited surface | | By-product | Low | High | <1 |
| during bias power ON | VI** | Ne | High | Low | >1 |
| for atomic layer etch | | Vbias | Low | High | <1 |

*OES: optical emission spectroscopy.
**VI: voltage current sensor.

Table 2 above shows a few examples of pulse features and pulse scores of the third plasma process 400C. In the first state 401, the source power 431 is ON while the bias power 433 is OFF. Accordingly, neutrals (or neutral species such as radicals) can be generated with no ions generated, corresponding to a relatively high radical density, a relatively low by-product signal, a relatively high electron density (Ne) and a relatively low bias voltage.

In the second state 402, the source power 431 is OFF while the bias power 433 is ON. Accordingly, ions can be generated with few or no neutrals generated, corresponding to a relatively low radical density, a relatively high by-product signal, a relatively low electron density (Ne) and a relatively high bias voltage.

Similarly, pulse scores can thus be obtained as interaction terms of pulse features of the first state 401 and pulse features of the second state 402. Such pulse features can include, but are not limited to, radical density, by-product generation/signal, electron density and bias voltage. The pulse scores can then be utilized to evaluate the plasma etching process, e.g. to determine whether etching is achieved only in the second state 402 relative to the first state 401, or to accelerate pulse optimization by plasma diagnostics without etching patterned wafer coupons.

In this example, four ratios can be obtained: a first ratio of radical density of the first state 401 to radical density of the second state 402, a second ratio of by-product generation of the first state 401 to by-product generation of the second state 402, a third ratio of electron density of the first state 401 to electron density of the second state 402, and a fourth ratio of bias voltage of the first state 401 to bias voltage of the second state 402. Particularly, etching is only activated during the second state 402 when the first ratio is larger than 1 (e.g. 2, 5, 10, 50, 100, 1000, 10000 or any values therebetween), the second ratio is smaller than 1 (e.g. 0, 0.001, 0.01, 0.1, 0.3, 0.5, 0.7, or any values therebetween), the third ratio is larger than 1 (e.g. 2, 5, 10, 50, 100, 1000, 10000, or any values therebetween), and the fourth ratio is smaller than 1 (e.g. 0, 0.001, 0.01, 0.1, 0.3, 0.5, 0.7, or any values therebetween).

In the examples of FIGS. 4B and 4C, when the source power (e.g. 421 and 431) or the bias power (e.g. 423 and 433) is ON, the source power or the bias power is each maintained at a respective constant value. In other examples, the source power 431 and/or the bias power 413 need not be maintained at a constant value when ON.

Figure 5A:
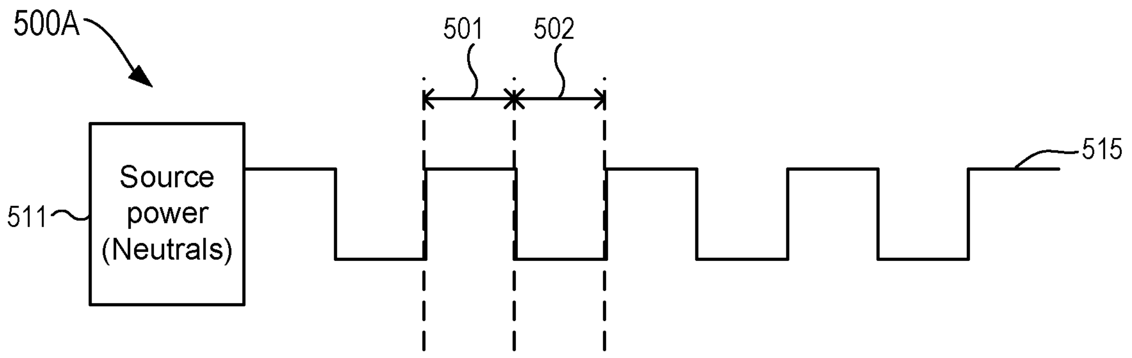
FIG. 5A shows a schematic of a pulsed plasma process, in accordance with some embodiments of the present disclosure.

FIG. 5A shows a schematic of a fourth plasma process 500A, in accordance with one embodiment of the present disclosure. As shown, the fourth plasma process 500A includes a pulsed plasma. A source power 511 (e.g. of a plasma source) is represented by line 515. The source power 511 is pulsed between a first state 501 and a second state 502. Specifically, the source power 511 is ON in the first state 501 and OFF in the second state 502.

Figure 5B:
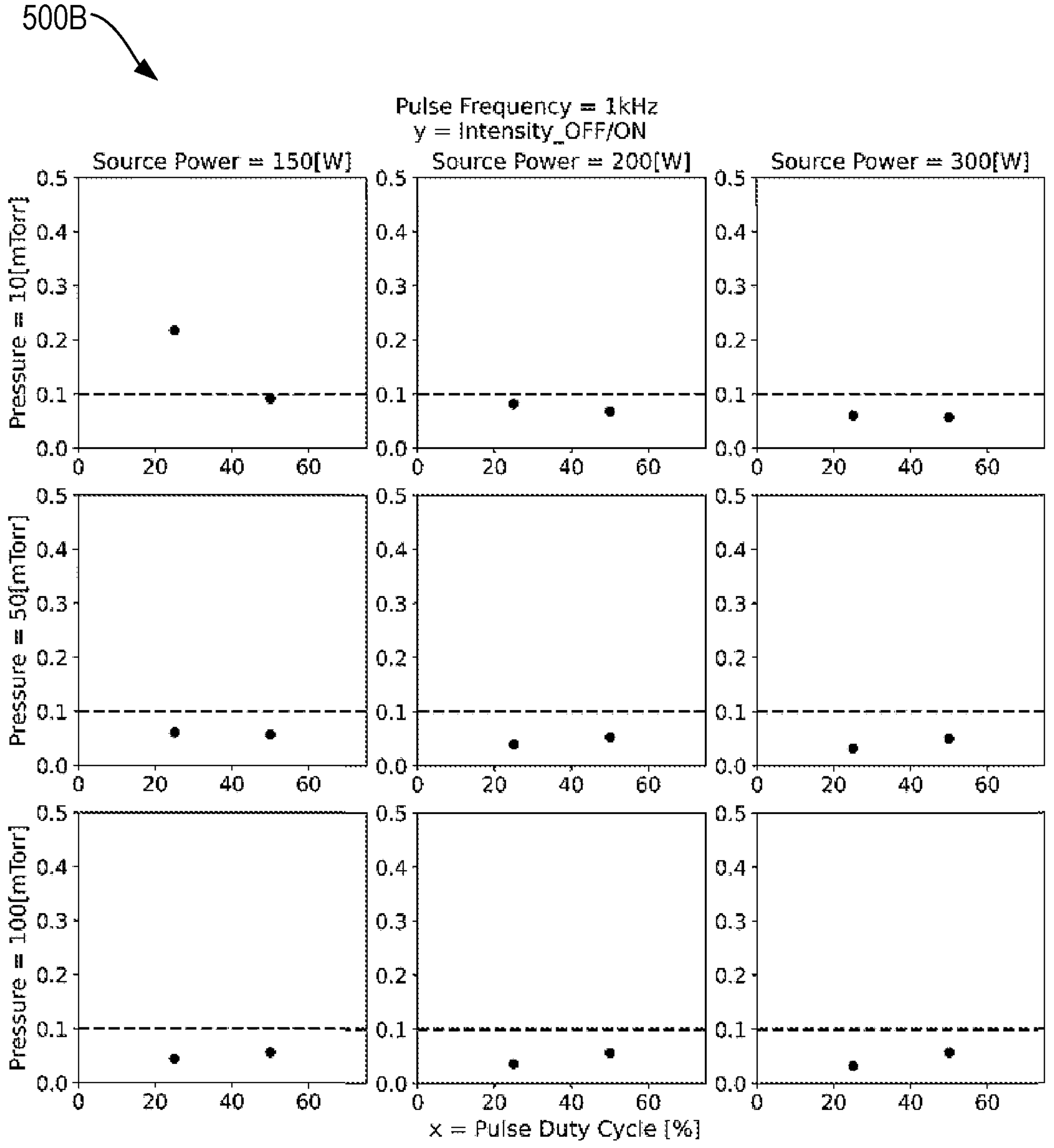
FIG. 5B shows some pulse score data, in accordance with some embodiments of the present disclosure.

FIG. 5B shows graphs 500B of some pulse score data, in accordance with some embodiments of the present disclosure. The pulse score data were collected under different experimental conditions: three source power conditions (e.g. 150 W, 200 W and 300 W), three pressure conditions (e.g. 10 mTorr, 50 mTorr and 100 mTorr) and two pulse duty cycle conditions (e.g. 25% and 50%). Data points represent pulse scores of Intensity_OFF/Intensity_ON, where Intensity_OFF and Intensity_ON respectively represent signal intensity in the second state 502 and signal intensity in the first state 501. Such signal intensity can be measured by a photodiode to probe electron density. As shown, pulse scores are generally good and under 0.1 with one outlier detected for a source power of 150 W and a pressure of 10 mTorr with a pulse duty cycle of 25%, which was determined to be weak in the ON state due to poor tuning.

Figure 5C:
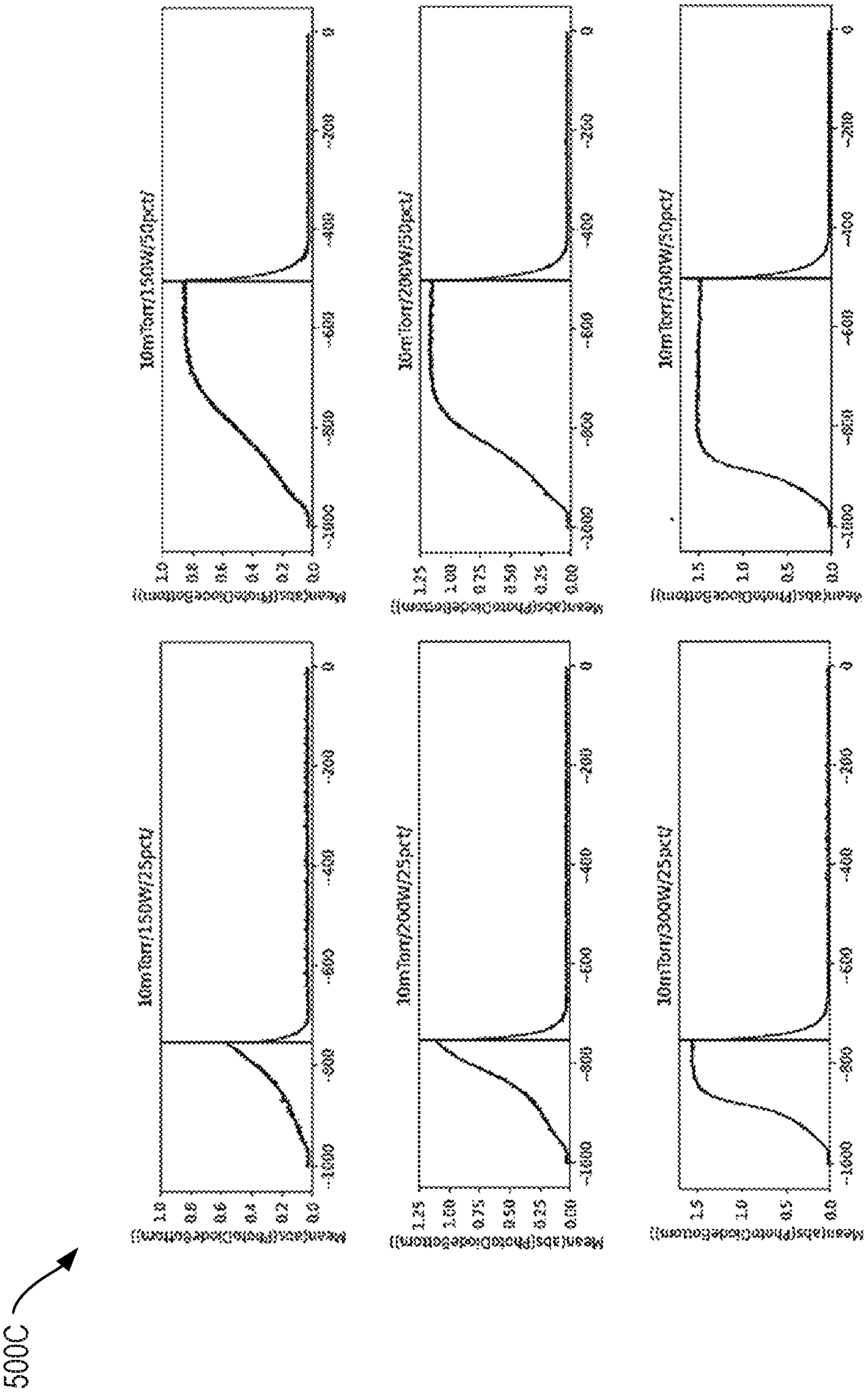
FIG. 5C shows some sensor data, in accordance with some embodiments of the present disclosure.

FIG. 5C shows graphs 500C of some sensor data, in accordance with some embodiments of the present disclosure. The sensor data were collected under different experimental conditions: three source power conditions (e.g. 150 W, 200 W and 300 W) and two pulse duty cycle conditions (e.g. 25% and 50%) with the same pressure condition (e.g. 10 mTorr). As shown, when the source power is 150 W and the pulse duty cycle is 25%, signal intensity is significantly lower than others. For example, the highest signal intensity is below than 0.6, which does not reach the expected level. Therefore, the outlier identified in FIG. 5B is confirmed to be a fault.

Figure 5D:
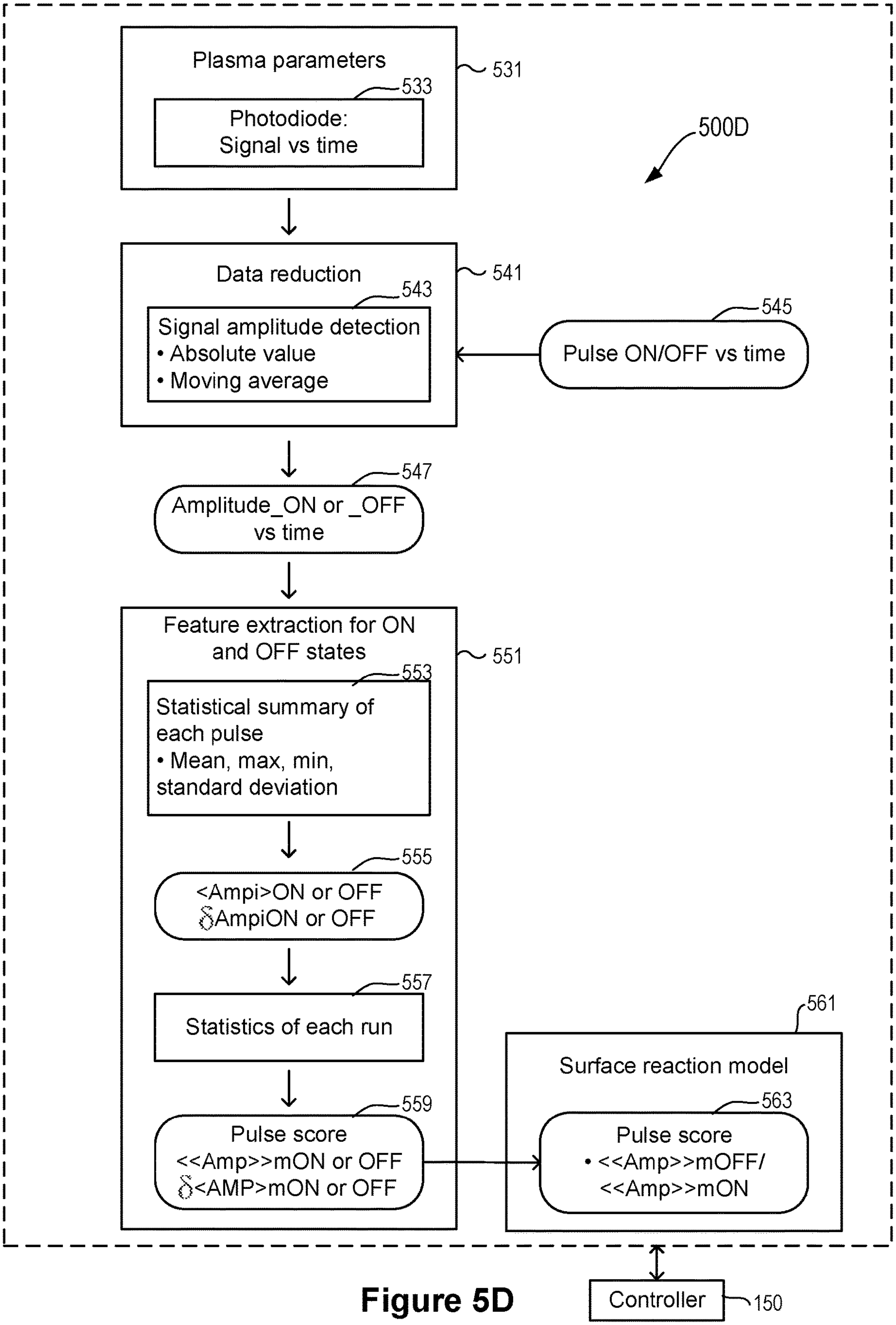
FIG. 5D shows a block diagram of acquiring pulse score data, in accordance with some embodiments of the present disclosure.

Data shown in FIGS. 5B and 5C can be obtained by a process 500D illustrated in FIG. 5D, in accordance with some embodiments of the present disclosure. In block 531, plasma parameters are obtained. For example in block 533, data of signal versus time can be obtained from a photodiode. The data of signal versus time and data 545 of pulse ON/OFF versus time are input into block 541 for data reduction. For example in block 543, signal amplitude detection is executed to obtain absolute values as well as moving averages. Then, data 547 of amplitude in an ON state and/or in an OFF state versus time can be obtained.

In block 551, features for ON and OFF states are extracted. In block 553, a statistical summary (e.g. mean, maximal and minimal values, standard deviation, etc.) can be obtained for each pulse. Then, data 555 of $<\text{Amp}_i>_{ON}$, $<\text{Amp}_i>_{OFF}$, $\delta\text{Amp}_{iON}$ and $\delta\text{Amp}_{iOFF}$ can be obtained. Specifically, $<\text{Amp}_i>_{ON}$ denotes a mean of photodiode amplitude for an i-th pulse in the ON state, (one pulse out of a total number of pulse trains (ON/OFF)). $<\text{Amp}_i>_{OFF}$ denotes a mean of photodiode amplitude for the i-th pulse in the OFF state. $\delta\text{Amp}_{iON}$ denotes a standard deviation of photodiode amplitude for the i-th pulse in the ON state. $\delta\text{Amp}_{iOFF}$ denotes a standard deviation of photodiode amplitude for the i-th pulse in the OFF state.

In block 557, statistics of each (chamber) run is obtained based on the data 555 of $<\text{Amp}_i>_{ON}$, $<\text{Amp}_i>_{OFF}$, $\delta\text{Amp}_{iON}$ and $\delta\text{Amp}_{iOFF}$. As a result, data 559 of $<<\text{Amp}>>_{mON}$, $<<\text{Amp}>>_{mOFF}$, $\delta<\text{Amp}>_{mON}$ and $\delta<\text{Amp}>_{mOFF}$ can be obtained. $<<\text{Amp}>>_{mON}$, denotes a mean of $<\text{Amp}_i>_{ON}$ for a m-th run (considering run-to-run data). $<<\text{Amp}>>_{mOFF}$, denotes a mean of $<\text{Amp}_i>_{OFF}$ for the m-th run. $\delta<\text{Amp}>_{mON}$ denotes a standard deviation of $<\text{Amp}_i>_{ON}$ for the m-th run. $\delta<\text{Amp}>_{mOFF}$ denotes a standard deviation of $<\text{Amp}_i>_{OFF}$ for the m-th run.

In block 561, a surface reaction model is used to obtain a pulse score 563. In this example, the pulse score 563 is $<<\text{Amp}>>_{mOFF}/<<\text{Amp}>>_{mON}$.

In some embodiments, the controller 150 may optionally be coupled to various components of the process 500D to receive inputs from and provide outputs for the components as well as implement the components, similar to the process 100 in FIG. 1. The descriptions have been provided above and will be omitted herein for simplicity purposes.

Figure 6:
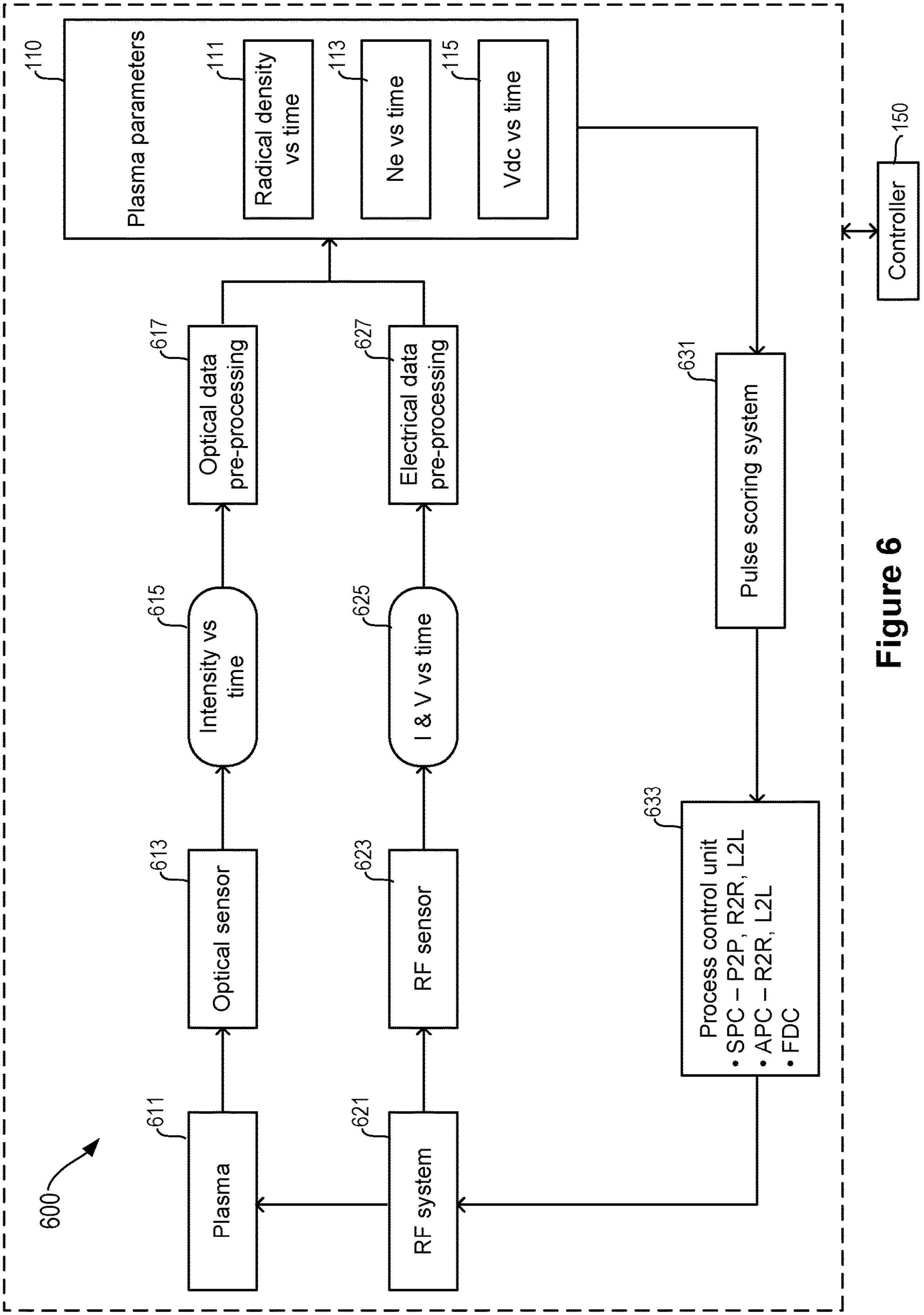
FIG. 6 shows a pulse scoring process for process control in accordance with some embodiments of the present disclosure.

FIG. 6 shows a process 600 of pulse scoring for process control in accordance with some embodiments of the present disclosure. As shown, the plasma parameters in block 110 are input into a pulse scoring system in block 631 for a process control unit in block 633. The pulse scoring system can be implemented by the process 100, 200 and the like. The process unit can include statistical process control (SPC) such as pulse-to-pulse (P2P), run-to-run (R2R), lot-to-lot (L2L), advanced process control (APC) such as R2R and L2L, fault detection classification (FDC), and the like.

The process control unit in block 633 can send outputs to a radio frequency (RF) system in block 621. One or more RF sensors in block 623 can be used to characterize or monitor the plasma etching process and/or the wafer. As a result, RF sensor data such as current (I) and voltage (V) data 625 versus time can be obtained. In block 627, electrical data are pre-processed, for example to remove variance and noise, before added to the plasma parameters in block 110.

In block 611, a plasma is generated for the plasma etching process. In block 613, one or more optical sensors can be used to characterize or monitor the plasma etching process and/or the wafer. As a result, optical data such as intensity 615 versus time can be obtained. In block 617, optical data are pre-processed, for example to remove variance and noise, before added to the plasma parameters in block 110.

In some embodiments, the controller 150 may optionally be coupled to various components of the process 600 to receive inputs from and provide outputs for the components as well as implement the components, similar to the process 100 in FIG. 1. The descriptions have been provided above and will be omitted herein for simplicity purposes.

Figure 7:
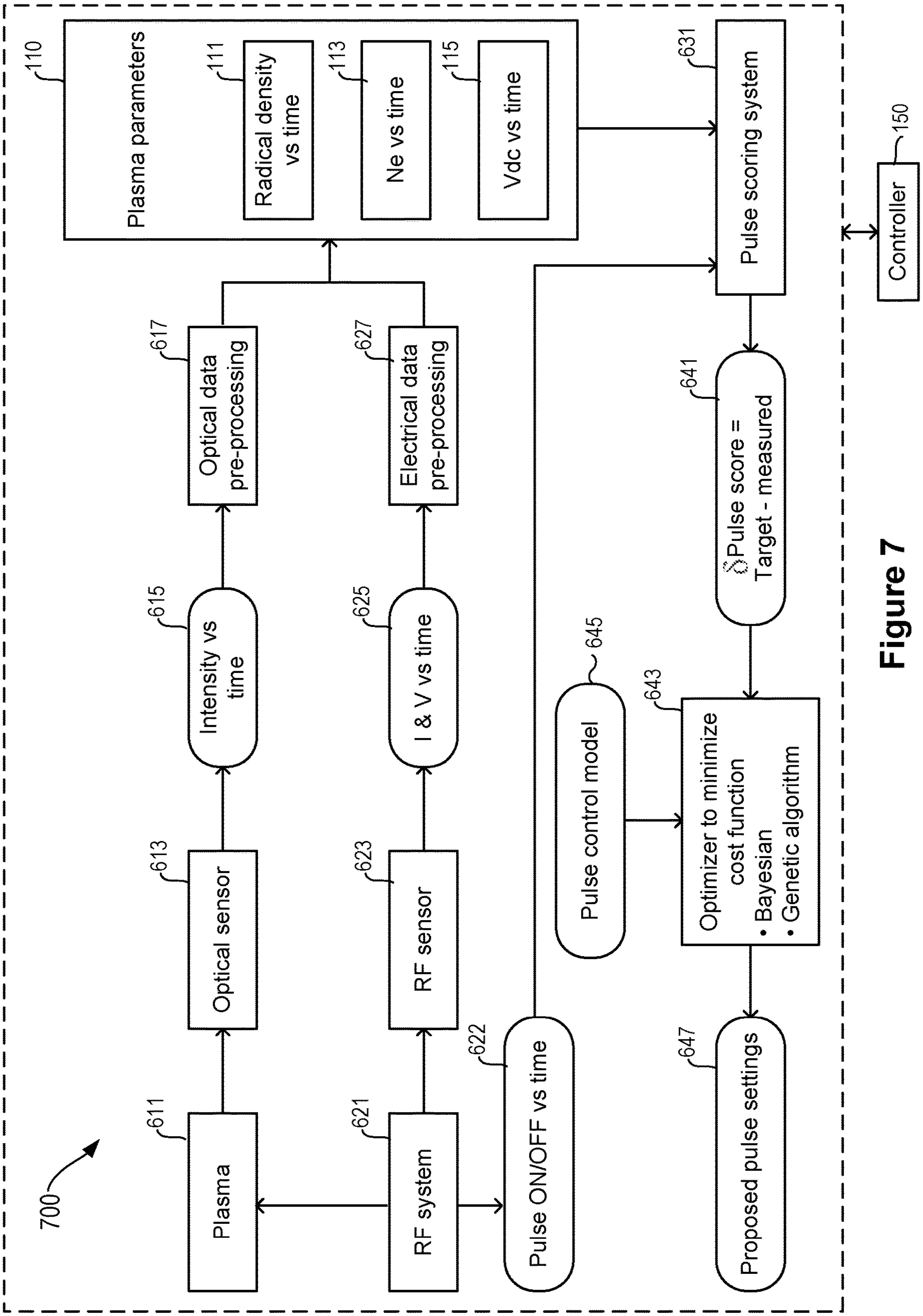
FIG. 7 shows a pulse scoring process for process optimization in accordance with some embodiments of the present disclosure.

FIG. 7 shows a process 700 of pulse scoring for process optimization in accordance with some embodiments of the present disclosure. The process 700 herein is similar to the process 600 in FIG. 6. Identical numerals can denote identical or similar components unless specified otherwise. Data 622 of pulse ON/OFF vs time can be obtained from the RF system in block 621 and sent to the pulse scoring system in block 631. Then, δ(pulse score) 641=PS_target−PS_measured is obtained, where PS_target denotes a target value of a pulse score, and PS_measured denotes a measured value of the pulse score. Note that δ(pulse score) 641 can be obtained for a single pulse score or a plurality of pulse scores, depending on specific applications. In block 643, δ(pulse score) 641 and a pulse control model 645 (e.g. the control model 233) can be used for an optimizer to minimize a cost function, for example by Bayesian statistics and/or genetic algorithm, in order to obtain proposed pulse settings 647 for optimized plasma etching.

Figure 8:
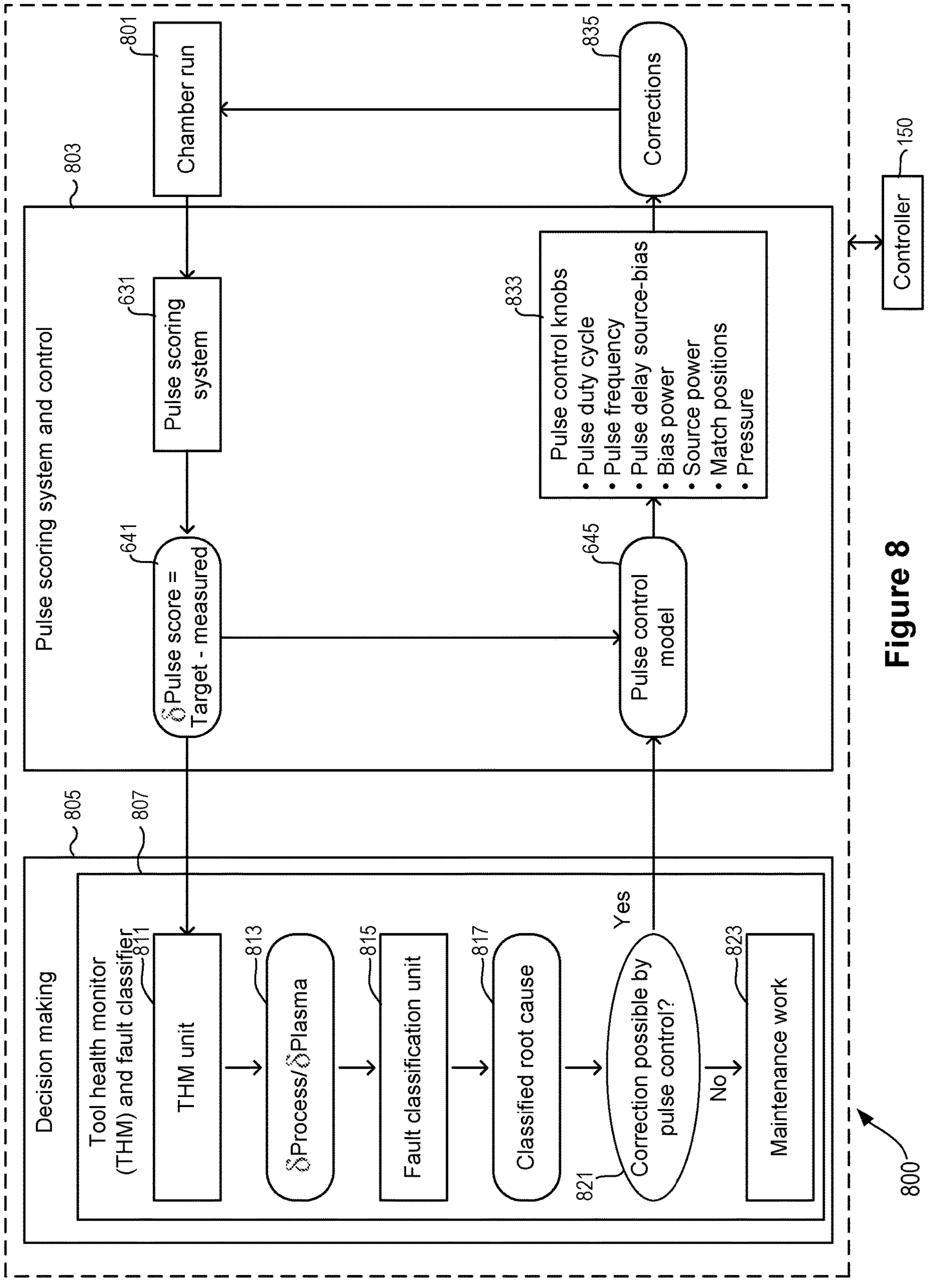
FIG. 8 shows a pulse scoring process for advanced/automatic equipment control in accordance with some embodiments of the present disclosure.

FIG. 8 shows a process 800 of pulse scoring for advanced/automatic equipment control in accordance with some embodiments of the present disclosure. In block 801, a plasma etching recipe is executed. In block 631, the pulse scoring system is used to obtain δ(pulse score) 641.

In block 805, decision making is executed. Block 807 can function as a tool health monitor (THM) and fault classifier. In block 811, a THM unit is used to obtain δProcess/δPlasma 813, which is then input into a fault classification unit in block 815 that outputs at least one classified root cause 817. In block 821, whether correcting the at least one classified root cause 817 is possible by pulse control is determined. If no, maintenance work is done in block 823.

If correcting the at least one classified root cause 817 is possible by pulse control, the process 300 proceeds back to block 803 for pulsing scoring control. Particularly, δ(pulse score) 641 is input into the pulse control model 645 to determine adjustments required for pulse control knobs in block 833. The pulse control knobs can include, but are not limited to, a pulse duty cycle knob, a pulse frequency knob, a pulse delay source-bias knob, a bias power knob, a source power knob, a match position knob and a pressure knob. As mentioned earlier, the pulse control model 645 may be the control model 233 that describes relationships between the pulse scores 229 and the pulse control knob settings 201. Therefore, δ(pulse score) 641 can be utilized to determine corrections 835 e.g. δ(pulse control knob settings). The corrections 835 can be made to the recipe for a future chamber run in block 801.

In some embodiments, the controller 150 may optionally be coupled to various components of the process 800 to receive inputs from and provide outputs for the components as well as implement the components, similar to the process 100 in FIG. 1. The descriptions have been provided above and will be omitted herein for simplicity purposes.

Figure 9:
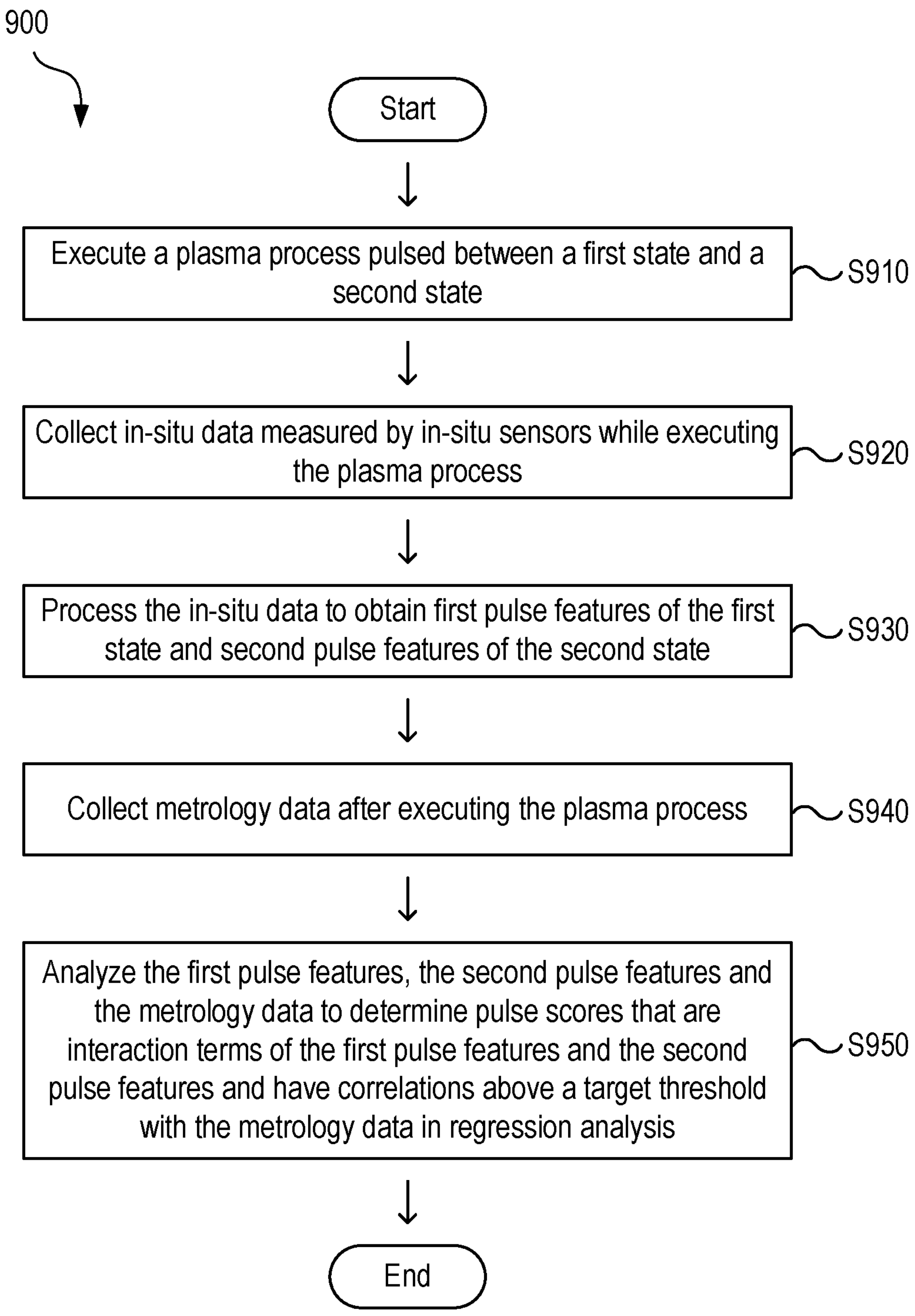
FIG. 9 shows a flow chart of pulse scoring in accordance with some embodiments of the present disclosure.

FIG. 9 shows a flow chart of a process 900 of pulse scoring in accordance with some embodiments of the present disclosure. At step S910, a plasma process pulsed between a first state and a second state is executed. At step S920, in-situ data measured by in-situ sensors are collected while the plasma process is being executed. At step S930, the in-situ data are processed to obtain first pulse features of the first state and second pulse features of the second state. At step S940, metrology data are collected after executing the plasma process. At step S950, the first pulse features, the second pulse features and the metrology data are analyzed to determine pulse scores that are interaction terms of the first pulse features and the second pulse features and have correlations above a target threshold with the metrology data in regression analysis.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "wafer" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

The substrate can be any suitable substrate, such as a silicon (Si) substrate, a germanium (Ge) substrate, a silicon-germanium (SiGe) substrate, and/or a silicon-on-insulator (SOI) substrate. The substrate may include a semiconductor material, for example, a Group IV semiconductor, a Group III-V compound semiconductor, or a Group II-VI oxide semiconductor. The Group IV semiconductor may include Si, Ge, or SiGe. The substrate may be a bulk wafer or an epitaxial layer.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

What is claimed is:

1. A method of pulse scoring, the method comprising:
executing a plasma process pulsed between a first state and a second state;
collecting in-situ data measured by in-situ sensors while executing the plasma process;
processing the in-situ data to obtain first pulse features of the first state and second pulse features of the second state;
collecting metrology data after executing the plasma process; and
analyzing the first pulse features, the second pulse features and the metrology data to determine pulse scores that are interaction terms of the first pulse features and the second pulse features and have correlations above a target threshold with the metrology data in regression analysis.

2. The method of claim 1, further comprising:
building a virtual metrology (VM) model that is configured to predict a wafer characteristic resulting from the plasma process based on the pulse scores.

3. The method of claim 2, wherein:
the plasma process comprises a plasma etching process, and
the wafer characteristic comprises a critical dimension, an etching rate or a combination thereof.

4. The method of claim 1, further comprising:
building a plurality of VM models each configured to predict a wafer characteristic resulting from the plasma process based on respective independent variables;
selecting a subset of VM models from the plurality of VM models, the subset of VM models determined to make reliable predictions within a threshold; and
selecting respective independent variables of the subset of VM models to be the pulse scores.

5. The method of claim 1, further comprising:
building a control model that describes relationships between the pulse scores and pulse control knobs.

6. The method of claim 5, further comprising:
when the pulse scores are outside target ranges, identifying a failure mode of a plasma tool.

7. The method of claim 6, further comprising:
when the failure mode is fixable by adjusting the pulse control knobs, determining adjustment of the pulse control knobs required to set the pulse scores to the target ranges using the control model.

8. The method of claim 6, further comprising:
when the failure mode is not fixable by adjusting the pulse control knobs, performing maintenance work on the plasma tool.

9. The method of claim 5, further comprising:
determining adjustment of pulse control knobs required to minimize a cost function of the pulsing scores.

10. The method of claim 5, wherein:
the pulse control knobs include at least one selected from the group consisting of a pulse duty cycle knob, a pulse frequency knob, a pulse delay source-bias knob, a bias power knob, a source power knob, a match position knob and a pressure knob.

11. The method of claim 1, wherein:
the pulse scores comprise a ratio of one of the first pulse features to one of the second pulse features.

12. The method of claim 1, wherein:
the plasma process is pulsed using at least one pulsed signal selected from the group consisting of a source power of a plasma source and a bias power applied on a wafer.

13. The method of claim 12, wherein:
in the first state, the source power is on while the bias power is off, and
in the second state, the source power is on while the bias power is on.

14. The method of claim 13, wherein the pulse scores comprise:
a first ratio of radical density of the first state to radical density of the second state,
a second ratio of by-product generation of the first state to by-product generation of the second state,
a third ratio of electron density of the first state to electron density of the second state, and
a fourth ratio of bias voltage of the first state to bias voltage of the second state.

15. The method of claim 14, wherein etching is only activated during the second state when:
the first ratio is between 0.8 and 1.2,
the second ratio is smaller than 1,
the third ratio is between 0.8 and 1.2, and
the fourth ratio is smaller than 1.

16. The method of claim 12, wherein:
in the first state, the source power is on while the bias power is off, and
in the second state, the source power is off while the bias power is on.

17. The method of claim 16, wherein:
the pulse scores comprise:
a first ratio of radical density of the first state to radical density of the second state,
a second ratio of by-product generation of the first state to by-product generation of the second state,
a third ratio of electron density of the first state to electron density of the second state, and
a fourth ratio of bias voltage of the first state to bias voltage of the second state, and
etching is only activated during the second state when:
the first ratio is larger than 1,
the second ratio is smaller than 1,
the third ratio is larger than 1, and
the fourth ratio is smaller than 1.

18. The method of claim 12, wherein:
when the bias power is pulsed, the bias power has a duty cycle of 10%-90%.

19. The method of claim 1, wherein:
the plasma process is pulsed at a frequency of 1 Hz to 100 kHz.

20. An apparatus, comprising a controller including a processor that is programmed to:
execute a plasma process pulsed between a first state and a second state;
collect in-situ data measured by in-situ sensors while executing the plasma process;
process the in-situ data to obtain first pulse features of the first state and second pulse features of the second state;
collect metrology data after executing the plasma process; and
analyze the first pulse features, the second pulse features and the metrology data to determine pulse scores that are interaction terms of the first pulse features and the second pulse features and have correlations above a target threshold with the metrology data in regression analysis.

* * * * *